United States Patent [19]

Dorsman

[11] Patent Number: 4,588,984
[45] Date of Patent: May 13, 1986

[54] CLOCKED PRECISION INTEGRATING ANALOG-TO-DIGITAL CONVERTER SYSTEM

[75] Inventor: Adrian K. Dorsman, Sheldon, Iowa

[73] Assignee: Rockwell International Corporation, El Segundo, Calif.

[21] Appl. No.: 560,773

[22] Filed: Dec. 12, 1983

[51] Int. Cl.⁴ .......................................... H03K 13/20
[52] U.S. Cl. .......................... 340/347 NT; 307/257; 324/99 D; 340/347 AD; 340/347 M
[58] Field of Search ............... 340/347 AD, 347 NT, 340/347 M, 347 CC; 307/257; 323/270, 271

[56] References Cited

U.S. PATENT DOCUMENTS 4,112,428  9/1978  Dorsman ........................ 340/347 M

FOREIGN PATENT DOCUMENTS 0070086  1/1983  European Pat. Off. .

Primary Examiner—T. J. Sloyan
Attorney, Agent, or Firm—H. Fredrick Hamann; James F. Kirk

[57] ABSTRACT

An analog-to-digital conversion system comprising: a precision floating current source for supplying a precision current to a current source terminal and for sinking an equivalent precision current at a current sink terminal, a summing terminal for receiving an analog signal current, enabling means for directing the flow of the precision current from the current source terminal to the summing terminal during a first mode of operation and for sinking the precision current from the summing terminal during a second mode of operation, an integrator for generating a voltage signal proportional to the integral of the sum of the precision and analog currents flowing through the summing terminal; and second means, coupled to the enabling means, being responsive to the voltage signal and to clock pulses for controlling the first and second modes of operation of the enabling means and for generating a digital representation of the amplitude of the analog current.

19 Claims, 7 Drawing Figures

CLOCKED PRECISION INTEGRATING ANALOG-TO-DIGITAL CONVERTER SYSTEM

BACKGROUND OF THE INVENTION

1. Field of the Invention

This invention relates to an analog-to-digital converter of the pulse width modulation type, and particularly to an incremental pulse width modulation type for generating a digital representation of the amplitude of an analog current with very low bias offset and bias drift errors.

2. Description of the Prior Art

This invention is an improvement over U.S. Pat. No. 3,918,050, entitled "ANALOG-TO-DIGITAL CONVERSION APPARATUS" and U.S. Pat. No. 4,112,428, entitled "CLOCKED PRECISION INTEGRATING ANALOG-TO-DIGITAL CONVERTER SYSTEM", both by A. K. Dorsman, and assigned to the same common assignee.

Prior Art systems, such as early three channel Analog-to-Digital Converter systems used in gyro stabilized cruise vehicle inertial guidance systems have been designed in which each channel had a dedicated precision current source and each current source had its own respective precision voltage reference. The drift characteristics of each respective channel in these early systems were influenced by the drift of the precision current source, the drift of each precision current source in turn being dependent on the drift characteristics of as many as five resistors in each current source circuit as well as the respective voltage source for the channel. The accuracy of these systems was also influenced by small changes in the input offset voltages, input bias currents and offset bias currents of error amplifiers or amplifiers used in integrator circuits.

SUMMARY OF THE INVENTION

It is a major objective of this invention to provide an improved analog-to-digital converter system having extremely low bias and scale factor errors and which provides a highly accurate digital readout value of an input analog current.

Another objective of this invention is to provide an analog-to-digital conversion system having more than one analog-to-digital conversion channel having a single precision voltage reference means referenced to a reference potential, such as ground, for providing a single system precision voltage reference, each respective analog-to-digital conversion channel being referenced to this single voltage source means.

Another objective of this invention analog-to-digital conversion system having at least one analog-to-digital conversion channel is to provide each analog-to-digital conversion channel with a floating first means for generating a precision unipolar current for each respective channel, each respective floating first means being referenced to the single system precision voltage reference. Another object of this invention is to characterize each floating first means as being adjusted by varying the value of a single resistor.

Yet another objective of this invention is to characterize each respective analog-to-digital conversion channel as having a drift characteristic matched to that of other additional analog-to-digital conversion channels by matching the temperature sensitivity, aging, thermal shock, mechanical shock, soldering shock, and lead bending sensitivity of the single resistor used in each floating first means as respective channel scale factor resistors.

It is yet another object of the invention to provide a multiple channel system in which each respective channel will manifest drift errors that track each other as a result of drift in the system's single precision voltage reference means. A reduced parts count and increased reliability results from the use of a single precision voltage reference.

Another object of this invention analog-to-digital conversion system is to provide long term drift stability, the drift stability being relatively insensitive to variations in the off-set voltage of operational amplifier circuits used in amplifier and integrator applications within each respective channel.

DESCRIPTION OF THE PREFERRED EMBODIMENT

Figure 1:
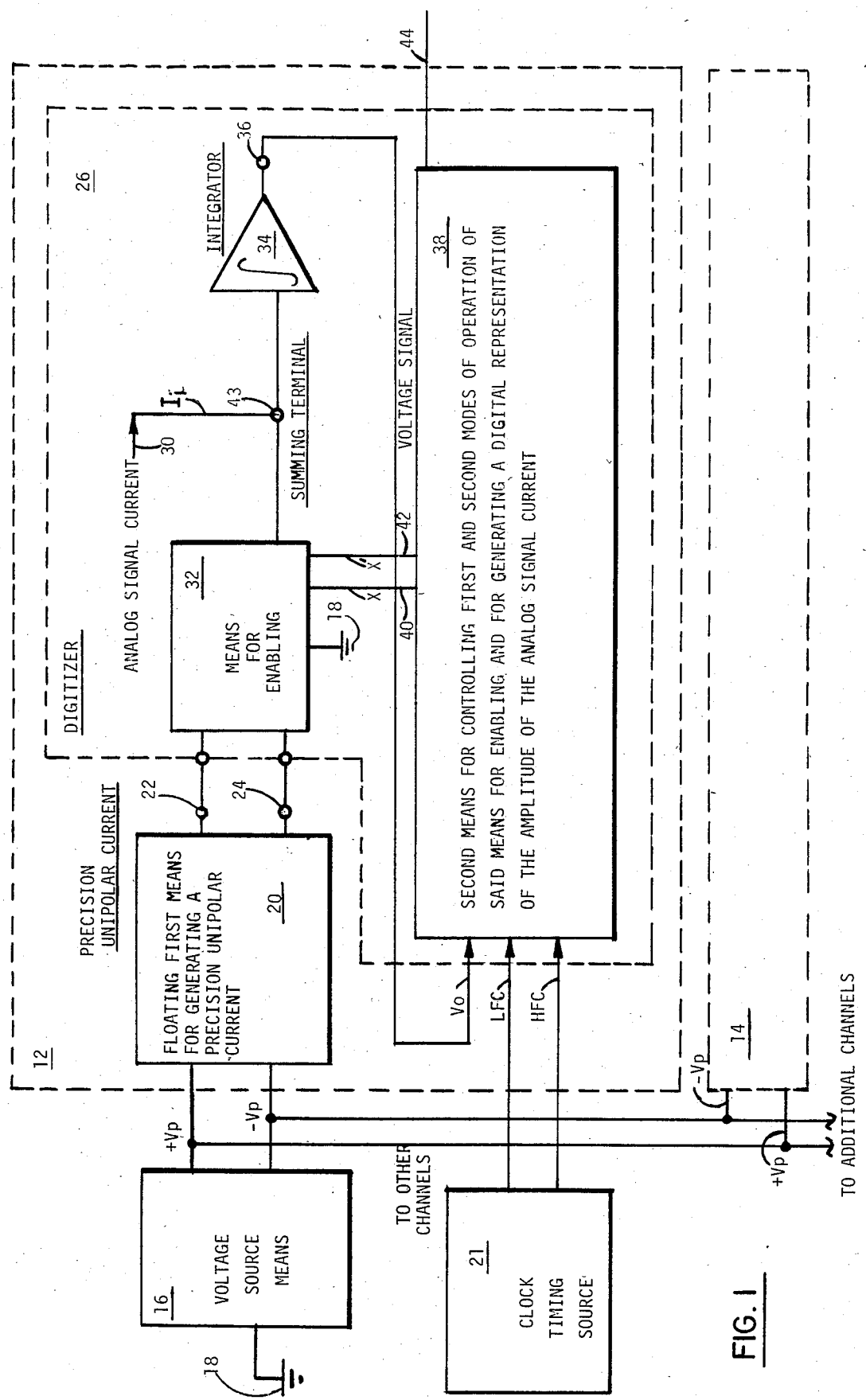
FIG. 1 is a block diagram of the improved invention, Analog-to-Digital Conversion System.

FIG. 1 depicts a block diagram of the invention analog-to-digital conversion system 10 having at least one analog-to-digital conversion channel 12. The invention system is meant to include additional analog-to-digital conversion channels such as that represented by phantom block 14.

The analog-to-digital conversion system 10 is shown having a voltage source means, represented by block 16, referenced to a reference potential, such as ground 18, for providing at least one precision voltage reference, such as $+Vp$ and $-Vp$.

The invention analog-to-digital conversion system of FIG. 1 is also depicted as having at least one analog-to-digital conversion channel represented by the contents of block 12. Each respective analog-to-digital conversion channel is meant to include a floating first means for generating a precision unipolar current. The floating first means is represented by block 20 and is shown being responsive to the precision voltage reference $+Vp$ and $-Vp$ from the voltage source means block 16. The floating first means provides a sink for a precision unipolar current at current sink terminal 22 and provides a source for the precision unipolar current at current source terminal 24.

The remaining elements comprising the analog-to-digital conversion channel are depicted as being contained in the digitizer block 26.

Each analog-to-digital conversion channel also has a summing terminal 43 for receiving an analog signal current on conductor 30.

A means for enabling the precision unipolar current to flow by way of a first direction through the enabling means, represented by phantom block 32, from a reference potential 18 through the floating first means 20 to the summing terminal 43 during a first mode of operation, and to flow by way of a second direction through the enabling means 32 from the summing terminal 43 through the floating first means 20 to the reference potential 18 during a second mode of operation.

An integrator 34 is provided for generating a voltage signal Vs at voltage signal terminal 36. The voltage signal Vs is proportional to the integral of the sum of the precision unipolar current and analog signal current flowing through the summing terminal 43.

FIG. 1 also shows a clock timing source 21 for providing timing signals. The timing source may contain a clock generator and frequency countdown circuits (not shown). In the preferred embodiment of FIG. 1, the timing source 21 develops clock signals designated as HFC and LFC having frequencies F1 and F2, respectively, these clock signals being coupled from the timing source 21 to the second means 38. The timing source typically contains a clock generator and frequency countdown circuits (not shown) and develops clock pulse signals at frequencies F1 and F2. Any frequency may be chosen for F1, with F2 being a sub-multiple of F1. In a typical application, F1 and F2 have been chosen to be frequencies of 40 Kilohertz (KHz) and 320 Hertz (Hz), respectively.

A second means 38 for controlling the first and second modes of operation of the means for enabling 32 and for also generating a digital representation of the amplitude of the analog signal current to summing terminal 43 is represented by phantom block 38. The second means for controlling the first and second modes of operation of the means for enabling 32 is responsive to the voltage signal Vo from voltage signal terminal 36 and provides logic signals X and X' on conductors 40 and 42 respectively, to the means for enabling block 32. Second means block 38 also includes a means for generating a digital representation of the amplitude of the analog signal current on output terminal 44.

Figure 2:
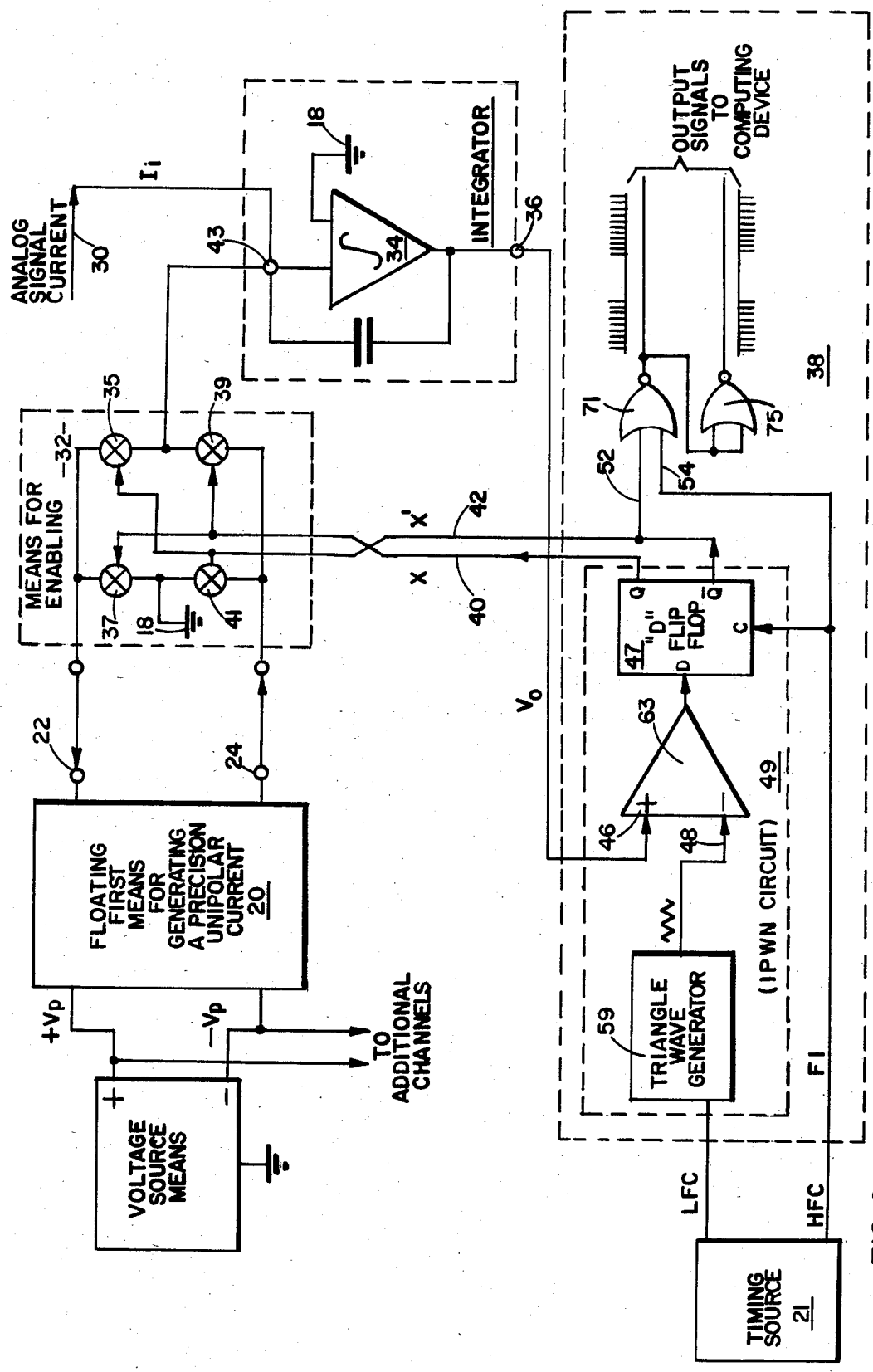
FIG. 2 is an expanded block diagram of the improved invention, clocked, precision, integrating Analog-to-Digital Converter System.

FIG. 2 shows the means for enabling block 32 as comprising a bridge array of first and second pairs of switches, such as first pair 37, 39 and second pair 35, 41. The first pair of switches 37, 39 enables the precision unipolar current to flow by way of a first path through a first switch 37 of the first pair of switches from the reference potential 18 to the current sink terminal 22, through the floating first means 20 to the current source terminal 24, through a second switch 39 of said first pair of switches to the summing terminal 43 during the first mode of operation.

The second pair of switches 35, 41 enables the precision unipolar current to flow by way of a second path through the first switch 35 of the second pair of switches from the summing terminal 43 to the current sink terminal 22, through the floating first means 20 to the current source terminal 24, through the second switch 41 of the second pair of switches to the reference potential 18 during the second mode of operation.

FIG. 2 depicts the second means for controlling the first and second modes of operation of the means for enabling, and for generating a digital representation of the amplitude of the analog signal current, as included within phantom block 38. The second means such as represented by the contents of block 38 includes an incremental pulse width modulation circuit, such as that included within phantom block 49; and, in addition, an output circuit, such as the circuitry including NOR gate 71 and NOR gate 75.

The incremental pulse width modulation circuit (IPWM) 49 is responsive to the voltage signal Vo from voltage signal terminal 36 and to a reference signal, such as the LFC clock signal from timing source 21 for generating first and second complementary signals, such as logic signals X and X' to control the first and second modes of operation of the enabling means represented by phantom block 32 by coupling signals X and X' to the control terminals of the first and second pair of switches, respectively. D flip-flop 47 receives the HFC clock signal at frequency F1 at its clock "C" input to enable it to be responsive to logic input changes at its "D" input.

The second means output circuit is shown comprising NOR gate 71 and NOR gate 75. The second means output circuit is responsive to a preselected one of the first and second complementary signals, such as X' from the Q output of D flip-flop 47 to the first input 52 of NOR gate 71; and also, to the clock pulses, such as the HFC clock pulses at frequency F1 from the timing source 21 to the second input 54 of NOR gate 71, for generating the digital representation of the amplitude of the analog current.

Figure 5:
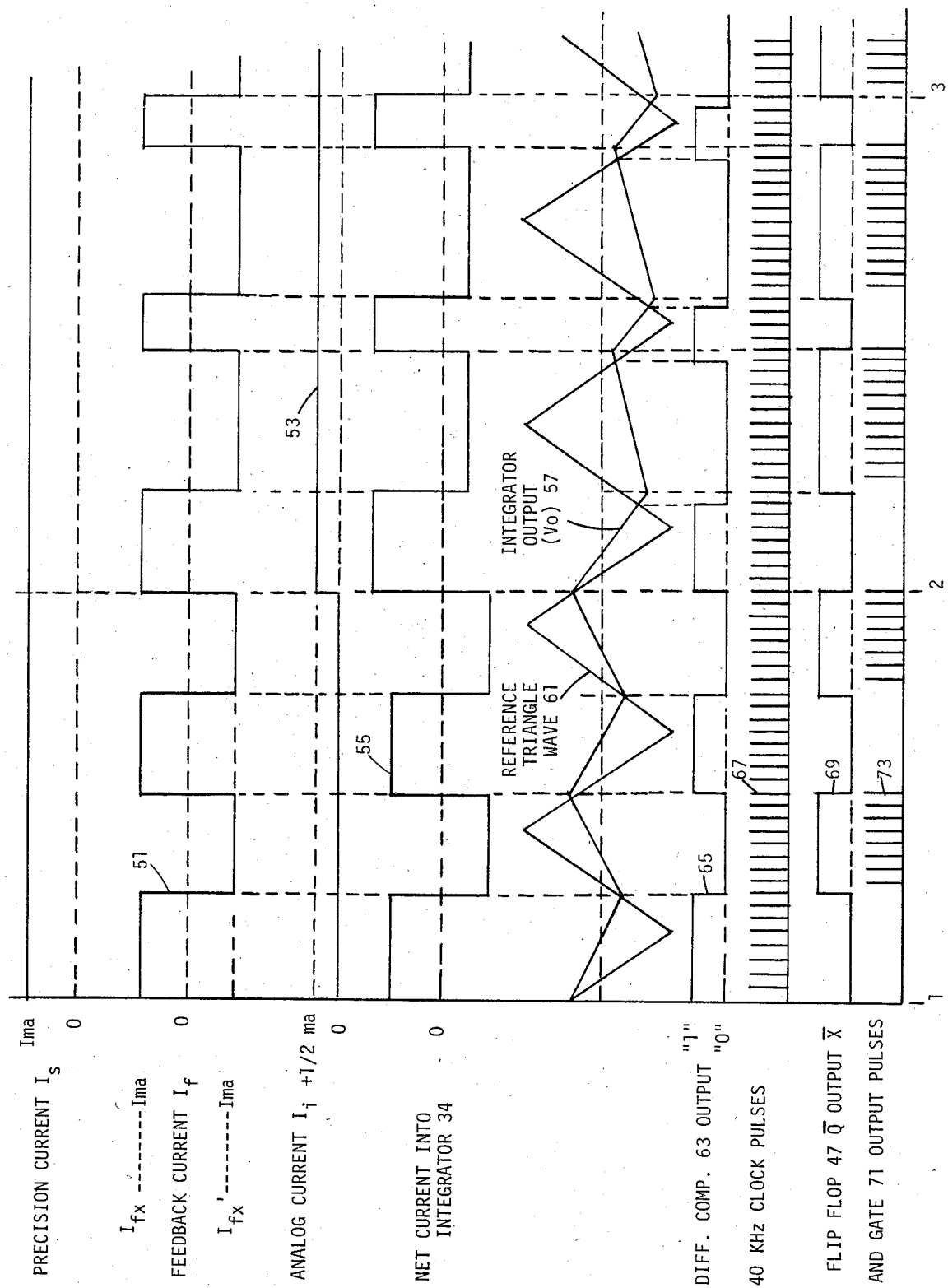
FIG. 5 illustrates waveforms useful in explaining the operation of the converter of FIGS. 1, 2, 3 and 4.

In a preferred alternative embodiment, the incremental pulse with modulator (IPWM) circuit 49 has a generator, such as triangle wave generator 59 that is responsive to, i.e. coupled to, the reference signal, such as the LFC clock frequency F2 from timing source 21, for developing a preselected signal wave form such as a symmetrical triangular wave illustrated as reference triangular wave 61 in FIG. 5.

The IPWM circuit represented by the contents of phantom block 49 in FIG. 2 includes a differential comparator circuit 63 for developing a third signal in response to the voltage signal Vo, from Vo terminal 36 to the comparators non-inverting input 46, and also in response to the preselected signal wave form, such as the symmetrical triangular wave signal from triangular wave generator 59 to the inverting input 48 of differential comparator circuit 63.

The third signal is represented by the differential comparator 63 output signal shown in FIG. 5 as wave form 65. The third signal is in a first binary state, such as represented by signal wave form 65 in FIG. 5 as a "1" when the voltage signal Vo, shown as wave form 57 in FIG. 5, is in a first polarity relationship with respect to the preselected signal wave form shown as reference triangle wave 61 in FIG. 5.

The third signal 65 is in a second binary state, such as that represented by signal wave form 65 in FIG. 5 as an "0" when the voltage signal Vo, shown as wave form 57 in FIG. 5, is in second polarity relationship with respect to the preselected signal wave form shown as reference triangle wave 61 in FIG. 5.

The IPWM flip-flop, such as D flip-flop 47, is responsive to the third signal and also to the clock pulses such as the HFC clock signal at frequency F1 from timing source 21, for developing the first and second complementary signals from its respective outputs Q and $\bar{Q}$.

FIG. 2 shows the output circuit NOR gate 75 connected to function as a simple single input inverter. The output circuit is a gating circuit responsive to the preselected one of the first and second complementary signals, such as X and X', for passing clock pulses, such as the HFC clock pulses at frequency F1 from timing source 21, during one of the modes of operation. The output circuit blocks the clock pulses, such as the HFC clock pulses, during the other of the modes of operation in order to generate the digital representation of the amplitude of the analog signal current $I_i$ into summing terminal 43. The output circuit is shown providing pulse outputs to a computing device.

Figure 3:
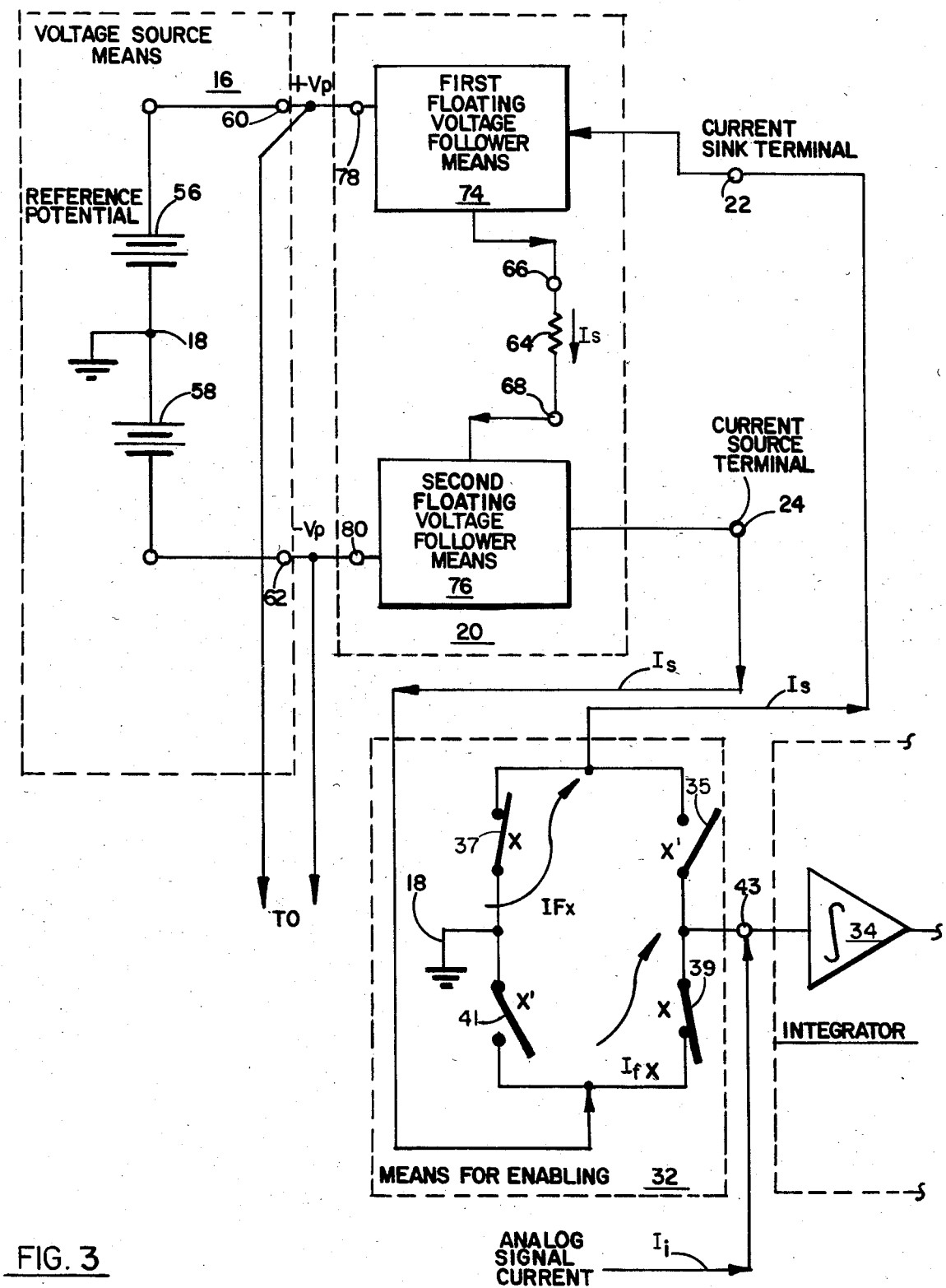
FIG. 3 is a simplified block diagram of the floating first means.

FIG. 3 shows voltage source means 16 as including a differential voltage reference source, such as first and second voltage references 56, 58, respectively, having first and second reference voltage source terminals 60, 62. The differential reference voltage source 16 provides first and second reference voltages $+Vp$, $-Vp$, respectively, with respect to the reference potential, such as ground 18, at the first and second reference voltage source terminals 60, 62.

An embodiment of the floating first means 20 in combination with voltage source means 16 is described in U.S. Pat. No. 4,528,495, having a common inventor, assignee, and filing date with this application.

Each respective floating first means 20 has: a current scaling resistor 64 having a first and second terminal 66, 68 respectively; a current sink terminal 22 coupled to the enabling means 32; a current source terminal 24 also coupled to the means for enabling 32.

Each respective floating first means also has a first floating voltage follower means 74 coupled to the current sink terminal 22 for sourcing the unipolar current from the current sink terminal 22 to the resistor first terminal 66; and a second floating voltage follower means, such as that represented by block 76, for sourcing the unipolar current from the resistor second terminal 68 to the current source terminal 24. The first and second floating voltage follower means 74, 76 each have respective inputs 78, 80 coupled to respective first and second reference voltage source terminals 60, 62. The first floating voltage follower 74 provides a voltage essentially equivalent to the first reference voltage $+Vp$ at the resistor first terminal 66; and, the second floating follower means 76 provides a voltage essentially equivalent to the second reference voltage $-Vp$ at the resistor second terminal 68. Each respective means for enabling, such as phantom block 32 is characterized as sourcing the unipolar current to the current sink terminal 22 and is also characterized as sinking the unipolar current from the current source terminal 24. The first and second voltage follower means 74, 76 operate to control the unipolar current magnitude to be equal to the ratio of the voltage difference between the first and second reference voltages, $+Vp$ and $-Vp$, to the scaling resistor 64 resistance such that:

$$I_s = ((+V_p) - (-V_p))/R_s \quad (1)$$

The function of the enabling means is represented by the contents of phantom block 32 in FIG. 3 by two pairs of switches, the first pair being closed and the second pair being open. The pairs of switches are configured in a bridge array of first and second pairs of switches, the first pair being designated by the symbol X and comprising switches 37, 39 and the second pair 35, 41 being designated by the symbol X'. The first pair of switches designated by X enables the unipolar current $I_s$ to flow by way of a first path as current $I_{fx}$ from the reference potential, such as ground 18, to the floating first means current sink terminal 22. The unipolar current then proceeds through the floating first means 20 to the floating first means current source terminal 24 and through the first pair of switches X to the summing terminal 43 during the first mode of operation.

The second pair of switches designated by X' and comprising switches 35, 41 enables the unipolar current to flow by way of a second path as current $I_{fx}'$ (not shown in FIG. 3) from the summing terminal 43 to the floating first means current sink terminal 22, through the floating first means 20 to the floating first means current source terminal 24 through the second pair of switches designated by X' to the voltage reference terminal, ground 18, during the second mode of operation. The magnitude of current $I_s$ is understood to be equal to the magnitudes of currents $I_{fx}$ and $I_{fx}'$.

Figure 4:
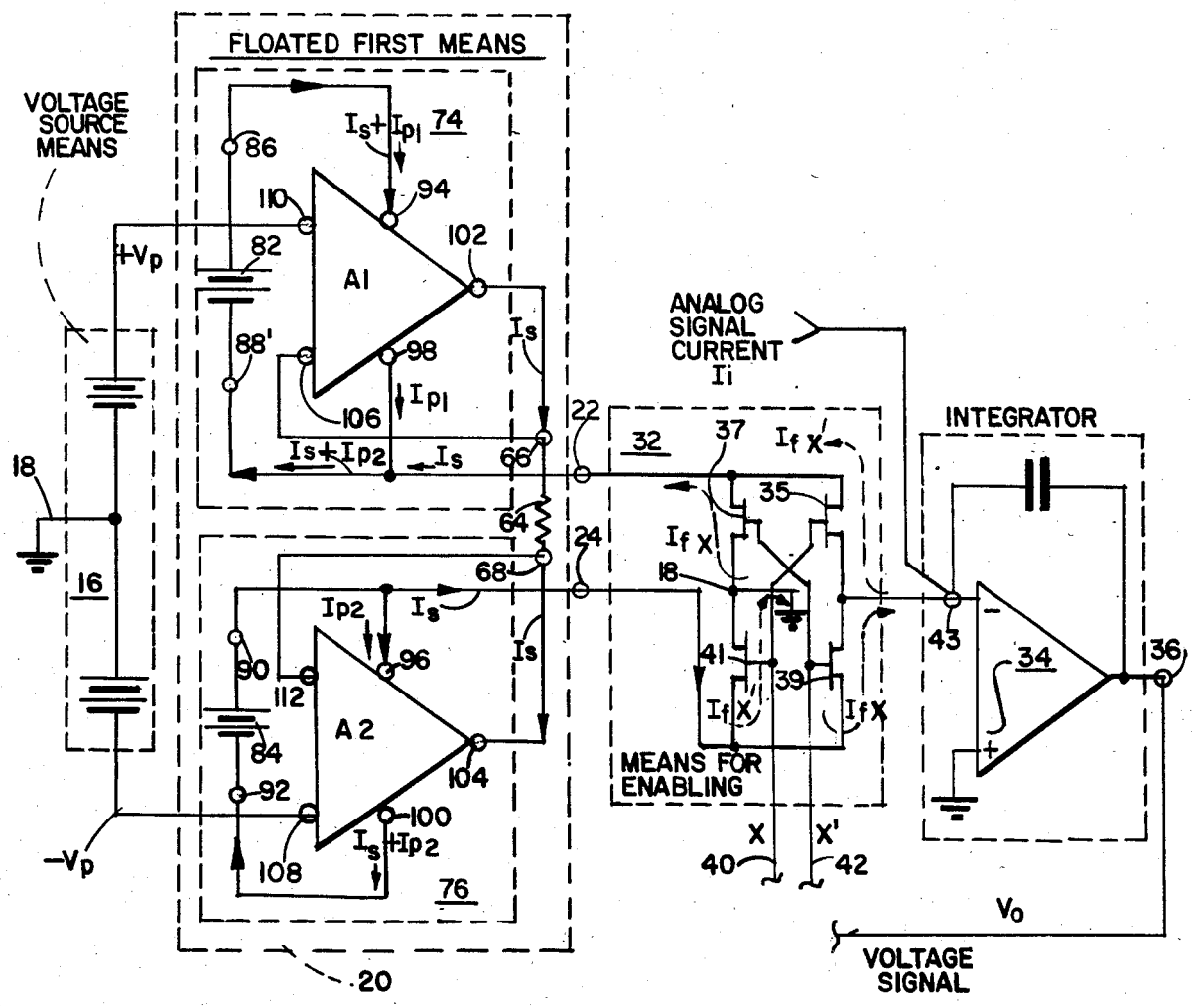
FIG. 4 is a schematic showing the relationship between the floating first means and the enabling means implemented using FET switches.

FIG. 4 shows a preferred embodiment of the floating first means as contained in phantom block 20 wherein each respective first and second floating voltage follower means 74, 76 respectively, further comprises: a respective isolated differential voltage source 82, 84 having at least a power 86, 90 and a return 88, 92 terminal. Each respective first and second floating voltage follower means 74, 76 also has a respective differential amplifier A1, A2, each respective amplifier having a power input terminal 94, 96 coupled to its respective isolated differential voltage source power terminal 86, 90 and its respective power return terminal 98, 100 coupled to its respective isolated differential voltage source return terminal 88, 92. Each respective differential amplifier A1, A2 also has an output terminal 102, 104; an inverting input terminal 106, 112 and a non-inverting input terminal 110, 108. The first differential amplifier A1 output terminal 102 is coupled, i.e. connected, to the first differential amplifier A1 inverting input terminal 106 and to the scaling resistor first terminal 66. The second differential output terminal 104 is coupled to the second differential amplifier A2 inverting input terminal 112 and to the scaling resistor second terminal 68. The first differential amplifier power return terminal 98 is coupled to the current sink terminal 22; and, the second differential amplifier power input terminal 96 is coupled to the current source terminal 24.

The first differential amplifier operates to conduct unipolar current from the current sink terminal 22 to the scaling resistor first terminal 66 and the second differential amplifier A2 operates to conduct the unipolar current from the scaling resistor second terminal 68 to the current source terminal 24. The first and second differential amplifiers A1, A2 are each isolated, each being powered by its respective isolated differential voltage source. Each respective differential amplifier is connected to operate as a voltage follower as described. The first voltage follower reproduces the voltage $+Vp$ at resistor first terminal 66 and the second voltage follower reproduces the voltage $-Vp$ at resistor second terminal 68. The result of this operation is to fix the voltage difference and therefore, the current through the precision scaling resistor. Since amplifiers A1 and A2 have essentially infinite input impedance at their respective non-inverting inputs 110, 108, essentially no current passes into our out of the these terminals. All of the current passing through the resistor must therefore circulate through the means for enabling switch pair selected by the respective first or second mode of operation. Small differences in the voltage across respective switches from one channel to another does not influence the current circulating through the switches. The current through the switches is fixed by the difference voltage across the precision resistor 64.

In another alternative preferred embodiment, the invention analog-to-digital conversion system is described as having an integrator coupled to the summing terminal 43 and having an input, the integrator generating a first voltage signal proportional to the integral of the sum of an analog current $I_i$, and the precision unipolar currents flowing through the summing terminal to the input, the first voltage signal being available at the integrator's output 36.

This embodiment also includes a bridge array of switches, represented by the contents of block 32 in FIG. 3, controlled by a control signal, such as logic signals X and X' having first and second voltage levels for enabling the precision unipolar constant current from current source terminal 24 to flow by way of a first direction through the bridge array of switches from a reference potential, such as ground 18, through the floating first means 20 to the summing terminal 43, i.e. the input of the integrator during the first voltage level of the control signal, i.e. when logic signal X is true, and to flow by way of a second direction through the bridge array of switches from the input of the integrator through the floating first means 20 to the reference potential, ground 18, during the second voltage level of the control signal, i.e. when logic signal X' is true.

Referring to FIG. 2, this alternative embodiment is also described as having means responsive to the first signal, or voltage signal from terminal 36, for developing the control signal, such as logic signals X and X', as a function of the amplitude of the analog current to summing terminal 43, and for generating a digital representation of the amplitude of the analog current. In this alternative embodiment, the means for developing the control signal includes a source of second and third signals, the second signal being represented by the low frequency reference timing signal LFC and the third signal being represented by the high frequency clock signal HFC. The means for developing the control signal also includes third means responsive to the first signal from terminal 36 and the second signal, such as LFC, for generating a comparison signal, and a fourth means responsive to the comparison and third signals for developing the control signal, such as logic signals X and X', and for generating a digital representation of the amplitude of the analog current.

The third means in the aforementioned alternative embodiment, includes a generator represented by block 59 that is responsive to the second signal, such as LFC, for developing a triangle wave signal. The third means also includes a comparator, such as 63, responsive to the first signal, or voltage signal from integrator output 36 to non-inverting input 46, and the triangle wave signal from triangle wave generator 59 at inverting input 48 for generating the comparison signal at the output of the comparator 63.

The fourth means of this alternative embodiment is meant to include a flip-flop, such as the D flip-flop of FIG. 2 responsive at its D input to the comparison signal from the output of comparator 63, and to the third signals, i.e. to the high frequency clock signal HFC to its C input, for precisely developing the control signal, such as logic signals X and X' from its Q and $\overline{Q}$ outputs, respectively. The fourth means is also meant to include a gate circuit, such as that characterized by NOR gate 71 and NOR gate 75, controlled by the output of the D flip-flop, i.e. by the X' logic signal to NOR gate input 52. This enables NOR gate 71 to pass third signals, such as the high frequency clock signal HFC from NOR gate input 54 to the output of NOR gate 71, the outputs of the gate circuit being digitally representative of the amplitude of the analog current $I_i$ to summing terminal 43. The output of NOR gate 75 is the complement of the output of NOR gate 71.

The analog-to-digital conversion system will now be explained in detail by referring to FIGS. 2, 4 and 5, FIG. 5 illustrating waveforms useful in explaining the operation of the analog-to-digital conversion system.

The floating first means 20 of FIG. 4 generates and applies a precision current Is (waveform 33) to bridge network of switches 35, 37, 39 and 41. The switches 35, 37, 39 and 41 are illustrated as field effect transistors (FETs) but any other suitable electronic switch, having suitable speed, a low enough voltage drop across the conduction channel for the application and low leakage current, could be utilized instead. The FET switches 35 and 37 are serially coupled together between the summing terminal 43 of integrator 34 and a reference potential such as ground 18, with their commonly connected drain electrodes coupled to the current sink terminal 22 of the floated first means 20. In a like manner, the FET switches 39 and 41 are serially coupled together between the summing terminal 43 of the integrator 34 and ground 18, with their commonly connected source electrode coupled to the current source terminal 24. The operation of FETs 35, 37, 39 and 41 is controlled by a D flip-flop 47 shown in FIG. 2, in an incremental pulse width modulator (I.P.W.M.) circuit 49 (to be explained later). The Q output of the flip-flop 47 develops an X signal output which is applied to the gate electrodes of the FETs 37 and 39, while the $\overline{Q}$ output of the flip-flop 47 develops the complement of the X signal, or X', which is applied to the gate electrodes of the FETs 35 and 41.

There are two modes of operation of the digitizer, the digitizer being represented in FIG. 1 by the contents of phantom block 26. Referring to FIG. 4, in the first mode of operation, the X and X' signals from the flip-flop 47 are in binary "1" and "0" logic states, respectively. As a result, during this first mode of operation, the FETs 35 and 41 are gated off and the FETs 37 and 39 are gated on to allow a current $I_{fx}$ to flow from ground 18 through the FET 37, to the current sink terminal 22, through the floated first means, to the current source terminal 24, and through the FET 39 to the summing terminal 43. In the second mode of operation the X and X' signals from the flip-flop 47 are in a binary "0" and "1" logic states, respectively. During the second mode of operation, the FETs 37 and 39 are gated off and the FETs 35 and 41 are gated on to allow a current $I_{fx}'$ to flow from the summing terminal 43 throught the FET 35 to the current sink terminal 22, through the floated first means to the current source terminal 24, and through FET 41 to ground 18. It should be noted that the complete path to or from ground for the current $I_s$ equal to $|I_{fx}|$ or $|I_{fx}'|$ is completed through the isolated power supply 82 to A1 power input terminal 94 through the A1 amplifier to output terminal 102, through the scaling resistor 64 into the A2 output terminal 104 to the A2 power return terminal 100 through the isolated power supply 84 to the current source terminal 24. Amplifiers A1 and A2 each require a relatively small power supply current to operate. Referring to FIG. 4, these currents are designated as $I_{pi}$ and $I_{p2}$. $I_{p1}$ leaves the A1 power return terminal 98 and passes through floating voltage source 82 along with $I_s$. The current entering terminal 94 is the sum of $I_s+I_{p1}$. In a similar fashion, $I_{p2}$ enters the A2 power input terminal 96, passes through A2 and exits the A2 power return terminal 100 with $I_s$. The sum of the $I_s$ and $I_{p2}$ currents pass through floating voltage source 84.

As a result of operation of the enabling means, a bipolar current is fed to or from the summing input terminal 43 due to the switching operation of the bridge network of switches 35, 37, 39 and 41. Bipolar current $I_f$ is the feedback current $I_f$ that is illustrated in waveform 51 of FIG. 5. The current $I_f$ is therefore equal to the algebraic sum of the $I_{fx}$ and $I_{fx}'$ currents flowing into or away from the summing terminal 43, with the positive and negative portions of the waveform 51 respectively representing the $I_{fx}$ and $I_{fx}'$ currents. For the purpose of illustration, assume that the digitizer 26 of FIG. 1 is implemented to receive and return a precision unipolar current $I_s = 1.0$ milliampere (1.0 ma) from the floating first means 20 for generating a precision unipolar current as shown in waveform 33 of FIG. 5. The feedback current $I_f$ produced by operation of the means for enabling block 32 would be either 1 ma or $-1$ ma, as shown in waveform 51 of FIG. 5.

The unknown input analog current $I_i$ applied to the summing terminal 43 is depicted as waveform 53 in FIG. 5 and is to be converted into a digital representation of its amplitude. The current $I_f$ and $I_i$ are summed at the summing terminal 43 to develop the net current into the integrator 34 (waveform 55). In response to this net current, the integrator 34 develops an output voltage $V_o$ (waveform 57) that is proportional to the integral of the sum of the $I_f$ and $I_i$ currents being applied to the summing terminal 43.

A triangle wave generator 59 in the IPWM circuit 49 is responsive to the LFC clock signal, (typically 320 Hz) from the clock timing source 21 (FIG. 1) for developing a 320 Hz zero-centered reference triangle wave signal, illustrated in FIG. 5 by the waveform 61. This triangle wave signal (wave form 61) and the integrator output voltage $V_o$ at output terminal 36 (waveform 57) are compared together in a differential comparator 63 to develop the waveform 65 (FIG. 5) at the output of the comparator 63 (FIG. 2). In examining the waveforms 57, 61 and 65, it can be seen that the waveform 65 is in a binary "0" state when the integrator output voltage $V_o$ is negative with respect to the triangle wave signal 61. In a like manner, the waveform 65 is in a binary "1" state when the integrator output voltage $V_o$ is positive with respect to the triangle wave signal 61 (FIG. 5).

The output (waveform 65) of the differential comparator 63 is applied to the "D" input of the flip-flop 47. The 40 KHz clock pulse signal HFC illustrated by the waveform 67 in FIG. 5 is applied to the clock "C" input of flip-flop 47. At each clock time of the 40 KHz clock, the X signal at the Q output of the flip-flop 47 either remains in or changes to the binary state of the signal (waveform 65) that was applied to its D input immediately before the clock pulse time. The complement of the X signal (X') appears at the $\overline{Q}$ output of the flip-flop 47. This X' signal at the $\overline{Q}$ output of the flip-flop 47 is also utilized as an IPWM pulse (waveform 69 in FIG. 5) since its average pulse width is proportional to the amplitude of the input analog current $I_i$ to be measured.

As stated previously, the X and X' signal outputs of the flip-flop 47 selectively control or drive the two pairs of FET switches (35, 41 and 37, 39) in the bridge network of switches to apply a bipolar precision current $I_f$ to the summing input terminal 43, at which input the bipolar current $I_f$ is algebraicly summed with the analog current $I_i$. The X and X' outputs of the flip-flop 47; therefore, determine the polarity of the bipolar precision current $I_f$ at any given time, as well as the time duration of each of the polarities of the $I_f$ current. The widths of the incremental pulse width modulator signals X and X' are controlled by the IPWM circuit 49 as a function of the amplitude of the analog current $I_i$.

The IPWM pulse signal X' from the $\overline{Q}$ output of the flip-flop 47 is also applied to an NOR gate 71 to selectively gate the HFC clock pulses at 40 KHz therethrough during the "0" state portions of the waveform 69 (FIG. 5). The output pulses of the NOR gate 71, illustrated by the waveform 73 in FIG. 5, are the digital representation of the amplitude of the unknown analog current $I_i$. These output pulses are counted by a computer device (not shown) to furnish an output digital display or readout. When the computing device requires a complementary pair of inputs, the output of the NOR gate 71 is inverted by a logic inverter, such as NOR gate 75, to develop the complement of the waveform 73 (FIG. 5), with the outputs of the NOR gate 71 and NOR gate 75 then being applied to the computing device (not shown).

The digitizer 13 operates to change the pulse width of each of the X and X' signals from the flip-flop 47 to enable the bridge network of switches 35, 37, 39 and 41 to control the average value of the feedback current $I_f$ such that the average value of the sum of the $I_f$ and $I_i$ currents entering and leaving the summing input 43 of integrator 45 is zero. This relationship can be seen from the equation:

$$I_{F_{AVE}} + I_{i_{AVE}} = 0 \tag{2}$$

As a result, the IPWM circuit 49 must generate that duty cycle at its X and X' signal outputs to cause the average feedback current $I_f$ to equal the negative of the value of the average input current. To find the duty cycle that the IPWM circuit 49 must generate in response to the application of a given value of analog current $I_i$ into digitizer 26 of FIG. 1, the following duty cycle equation (3) can be formulated:

$$\text{Duty Cycle} = [(I_i/I_s) + 1]*0.5 \tag{3}$$

where $I_i$ = the amplitude of the input analog current, and $I_s$ = the amplitude of the precision current developed by the floating first means 20. To more clearly understand the operation of the digitizer 26 of FIG. 1, assume that $I_f = +1$ ma when the signal X enables the FETs 37 and 39 and that $I_f = -1$ ma when the signal X' enables the FETs 35 and 41 as illustrated in the waveform 51 (FIG. 5). It will be recalled that the $I_f = I_{fx} + I_{fx}'$ where $I_{fx}$ is a positive current flowing into the summing terminal 43 during the first mode of operation, while $I_{fx}'$ is a negative current flowing away from the summing terminal 43 during the second mode of operation. Therefore, when $I_f = +1$ ma, then $I_{fx} = +1$ ma and $I_{fx}' = 0$ ma. Conversely, when $I_f = -1$ ma, $I_{fx} = 0$ ma and $I_{fx}' = -1$ ma.

Now assume that the analog current $I_i = 0$, as illustrated by the waveform 53 (FIG. 5) between times $T_1$ and $T_2$. When the FETs 37 and 39 are gated on (and the FETs 35 and 41 gated off), $+1$ ma of feedback current $I_f$ (or $I_{fx}$) flows into the summing terminal 43. Similarly, when FETs 35 and 41 are gated on (and the FETs 37 and 39 are gated off), $-1$ ma of feedback current $I_f$ (or $I_f$) flows from the summing terminal 43. Since the average value of the sum of the currents $I_f$ and $I_i$ entering and leaving the summing terminal 43 must be = to zero and $I_i$ has been stated to be = to 0 ma. In this explanation, the pair of FETs 35 and 41 (as well as the pair of FETs 37 and 39) has a 50% duty cycle since each pair of these switches is already on and off 50% of the time. The substitution of the values $I_i=0$ and $I_s=1$ ma into equation (2) will confirm the fact that a 50% duty cycle is generated by the IPWM circuit 49 when $I_i=0$ ma during the time period $t_1$-$t_2$ of FIG. 5.

Now assume that the analog current $I_i = +\frac{1}{2}$ ma, as illustrated in the waveform 53 (FIG. 5) during the time period $T_2$-$t_3$. Since the current $I_i$ is positive in value, it is flowing into the summing terminal 43.

As indicated in equation (2), the average value ($I_{FAVE}$) of the feedback current $I_F$ flowing into and away from the summing terminal 43 of integrator 34 must be = to $-\frac{1}{2}$ ma when $I_i = +\frac{1}{2}$ ma during the time period $T_2$-$T_3$ of FIG. 5. The substitutional values $I_i + \frac{1}{2}$ ma and $I_s=1$ ma into equation (3) discloses that a 75% duty cycle is generated by the IPWM circuit 49 when $I_i = +\frac{1}{2}$ ma during the time period $t_2$-$t_3$ of FIG. 5. In other words, on the average, the pulse width of the X signal (or IPWM pulse 69) is such that the FETs 35 and 41 are gated on 75% of the time and gated off 25% of the time, while the pulse width of the X' signal is such that FETs 37 and 39 are gated off 75% of the time and gated on 25% of the time.

Referring to equation (3) it can be seen that the IPWM circuit 49 will generate duty cycles of 0%, 25% and 100% when the analog currents $I_i$ is respectively equal to $-I_s$, $-\frac{1}{2}I_s$ and $+I_s$.

Referring again to FIG. 2 the digitizer 26 can be implemented to operate with values of $I_i$ between $-1$ ma and $+1$ ma. Thus, any changes in the amplitude or polarity of the input analog current $I_i$ are detected by changes in the pulse width of the positive portion of the IPWM pulse 69 at the Q output of flip-flop 47, and measured by corresponding changes in the number of 40 KHz clock pulses passing through the NOR gate 71 (and NOR gate 75) to the computing device (not shown). It should, however, be understood that other operating parameters are equally within the purview of the invention. For example, the digitizer 26 of FIG. 1 could be implemented to operate with a higher value of $I_s$ if the range of $I_i$ were greater. Equation (3) indicates that for best operation the digitizer 26 should operate between duty cycles of 0% and 100% with a duty cycle of 50% being developed when $I_i=0$ ma. The digitizer of FIGS. 1 through 4 could also be implemented to develop first and second output bursts of pulses during the times when the IPWM pulse 69 was positive and negative, respectively. In this case, the computing device (not shown) could be an up/down counter which would increment its count with the burst of pulses developed during the time the IPWM pulse 69 was, for example, positive and decrement its count with bursts of pulses developed during the time the IPWM pulse was negative.

There are several additional important advantages of the invention which should now be discussed.

Firstly, as the bridge switches the constant current $I_s$ from the floating first means 20, negligible errors result even though the FET switches 35, 37, 39 and 41 have finite "on" resistances because the current is constant, irrespective of the "on" resistance. In those previously mentioned prior art systems which utilized voltage switching techniques, switching errors resulted which were cumulative, resulting in relatively substantial output errors. In addition, the bridge switching of the precision current $I_s$ provides a much more symmetrical switching of current than the system described in U.S. Pat. No. 3,918,050 issued Nov. 4, 1975 to same inventor and assignee.

Secondly, the frequency of the X and X' signals from the complementary Q and $\overline{Q}$ outputs of the flip-flop 47 can be low and at a constant frequency so that switching errors can be made negligible.

Thirdly, the measurement of the duration or pulse width of the IPWM pulse 69 is substantially an exact measurement, because the pulse width changes only in discrete steps equal to the period of the 40 KHz clock pulses being applied to the flip-flop 47 and being read out of the NOR gate 71 (and NOR gate 75). Other known digitizing systems utilizing pulse width modulation reset pulses fail to increment the pulse width of the pulse width modulation (PWM) pulse with any readout clock pulses. Thus, the measure of the pulse period in these prior art systems results in a maximum error of plus or minus one clock pulse period per period of the IPWM pulse, which can become a very large cumulative error. The incremental pulse width modulation technique of the invention avoids such a cumulative error, because any error in the measurement of the duration of the positive portion of IPWM pulse, which is either plus or minus one readout clock pulse period, is stored in the integrator 45 and does not result in an accumulated error. In fact, for any given number of IPWM pulse periods, the total error in the given number of IPWM pulse periods remains either plus or minus one 40 KHz clock pulse period. This one readout clock pulse period error is stored in the charge of the integrator capacitor (in FIG. 1 but is shown in FIG. 2) in the integrator 34 and is carried over into the next IPWM pulse period, without the accumulation of any added error.

Fourthly, the utilization of incremental pulse width modulation in the invention allows the use of a relatively low $F_2$ frequency. It will be recalled that in FIG. 2, the frequency $F_2$ was selected to be 320 Hz. This 320 Hz clock frequency was utilized by the IPWM circuit 26 to generate the triangle wave (waveform 61) for a voltage comparison with the integrator 45 output $V_o$ (waveform 57). This voltage comparison resulted in the development of the IPWM pulse 69. The $F_2$ frequency therefore controls the period of this IPWM pulse at the output of the flip-flop 47. The lower frequency limit for the choice of $F_2$ is set by the required bandwidth for the digitizer 26. Thus, for certain applications the frequency $F_2$ can be as low as 10 Hz or as high as 1000 Hz. At the same time, the output resolution or accuracy of the IPWM pulse measurement, can be set to any value desired. In the embodiment of FIG. 2, a 40 KHz clock frequency was used for $F_1$. This 40 KHz clock frequency gives an output resolution of one part per 40,000 of full scale for a one second sample period (or $F_3$). If $F_1$ were selected to be = 1 MHz, an output resolution could be achieved of 64 parts per million of full scale for the 1/64 second sample period of $F_3$ to control the sample period of the computing device. In a like manner, much higher output resolutions can be achieved with this invention by increasing the frequency $F_1$ and/or decreasing the frequency $F_3$. However, it will be recalled that the clock pulse frequencies $F_2$ and $F_3$ must be derived from the same timing clock frequency $F_1$ (FIG. 1) and that they all must be related to each other by appropriate discrete ratios.

Fifthly, the digitizer 26 produces output pulses from the NOR gate 71, as well as from the NOR gate 75, which can be readily counted, rather than a pulse width modulated signal which requires peripheral equipment to measure the times of the pulse periods.

Finally, one of the main features of this invention is that it does not contain any bias setting resistors. As a result, no bias current is specifically provided in the invention. Such absence of bias setting resistors is due to the fact that the invention utilizes circuits to provide a bipolar switched precision current. By not using bias resistors to provide a bias current, an improved analog-to-digital converter is provided which generates a highly accurate digital representation of the amplitude of an analog current with very low bias offset and bias drift errors, as well as with very low scale factor errors. On the other hand, none of the previously described voltage switching techniques or the unipolar current switching technique can provide a system having both very low bias and scale factor errors. Hence these prior systems cannot provide the readout accuracy that this invention provides.

The invention thus provides an incremental pulse with modulation type of analog-to-digital converter for generating a highly accurate digital representation of the amplitude of an analog current by precisely switching the direction of flow of a precision current into or away from a summing input of an integrator as a function of the amplitude of the analog current in order to generate and digitally measure the period of a switching control signal which is proportional to the amplitude of the analog current.

Figure 7:
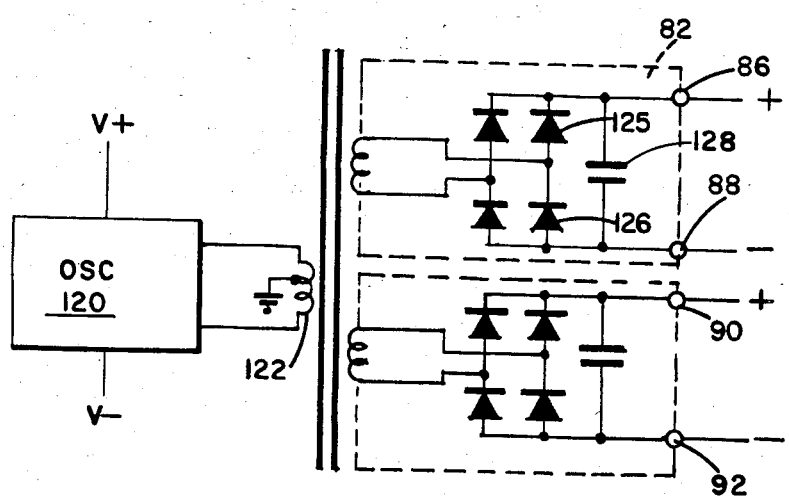
FIG. 7 is a simplified schematic of a pair of floated voltage supplies.

FIG. 7 shows a circuit suitable for providing first and second isolated differential voltage sources such as 82 and 84 for providing isolated power to the first and second voltage follower means circuits 74, 76 respectively. The circuit of FIG. 7 typically comprises a conventional oscillator 120 driving transformer 122 in push-pull fashion at a frequency of typically 50 KHz. The secondary voltages produced are square wave voltages that are rectified by diodes, such as diodes 124, 126, and by capacitor 128 to provide an isolated differential voltage source between terminal pairs 86, 88 and 90, 92. The power requirement to drive the A1 and A2 amplifiers of FIG. 4 and to source the precision current $I_s$ at current source terminal 22 is derived from the V+ and V− terminals of a source such as that depicted in FIG. 7.

The A1 and A2 amplifiers are typically monolithic circuits having inputs, such as 110 and 106 that require virtually no current. A typical amplifier suitable for use in this application would include the Harris Semiconductor HA-5130 having a maximum input bias current of 2 nano amps. The offset voltage is typically less than 10 micro volts.

Operating as a voltage follower, in the circuit of FIG. 4, amplifiers of this type would produce a voltage across the scaling resistor 64 essentially equal to the precision voltage reference difference voltages between terminals 78 and 80. By essentially equal, we mean within a few microvolts. It should be noted that monolithic operational amplifiers of this type conventionally incorporate internal compensation.

The preferred embodiment uses precision voltage references that are essentially equal, i.e. $|+V_p|=|-V_p|$; however, circuit operation is not restricted to this requirement. In addition, although the isolated voltage sources 82, 84 are equal in the preferred embodiment, this is also not a requirement. The magnitude of these sources must be sufficient to support linear operation of the A1 and A2 amplifiers. No uncontrolled path from the respective amplifiers should be permitted to insure that all current passes through the scaling resistor 64.

Figure 6:
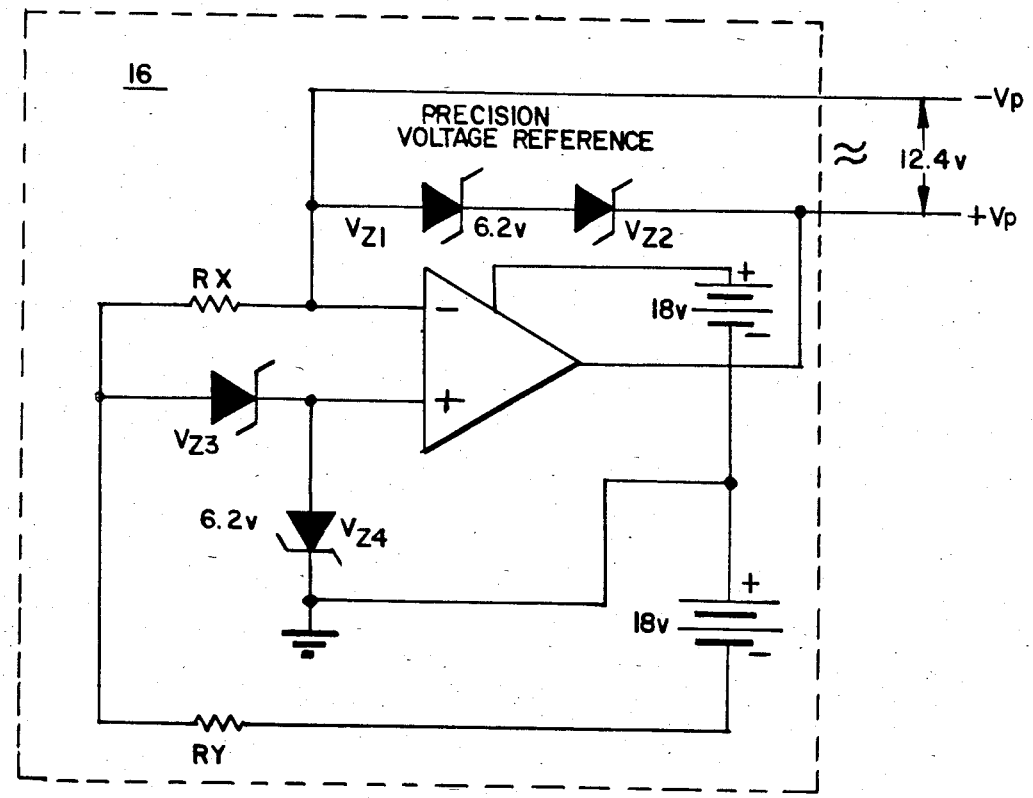
FIG. 6 is a schematic of a typical precision voltage reference.

FIG. 6 represents a preferred embodiment of a ground referenced precision reference voltage source suitable for use with the invention floating precision current source. The +18 V source of FIG. 3b provides a bias current through zener diodes $V_{Z3}$ and $V_{Z4}$, the bias current being limited by resistance $R_y$. The (−) and (+) inputs of the amplifier of FIG. 3b are at essentially the same voltage, i.e. $-V_{Z4}$ volts below ground. The voltage across the resistance $R_x$ is fixed at $V_{Z3}$ Volts; thereby, fixing the current through zener diodes $V_{Z2}$ and $V_{Z1}$ from the +Vp output from the output of the amplifier. By selecting zener diodes to have equal zener voltages, $-V_p$ can be made essentially equal to $+V_p$; however, the $|-V_p|$ need not be exactly equal to that of $|+V_p|$ for use with the floating precision current source since the voltage followers are floating and the difference voltage between $-V_p$ and $+V_p$ across $R_s$ controls the precision unipolar current. The precision reference 16 can service the reference voltage inputs for several floating precision current source circuits of type 20.

While the salient features have been illustrated and described, it should be readily apparent to those skilled in the art that modifications can be made within the spirit and scope of the invention as set forth in the appended claims.

What is claimed is:

1. An analog-to-digital conversion system comprising:
    a voltage source means referenced to a reference potential, such as ground, for providing at least one precision voltage reference, and
    at least one analog-to-digital conversion channel, each respective analog-to-digital conversion channel having:
    a floating first means for generating a precision unipolar current, each respective floating first means being responsive to said precision voltage reference and having:
    a scaling resistor, having a predetermined resistance value, and a first and second terminal;
    a current source terminal, and
    a current sink terminal;
    said floating first means being characterized as sourcing said precision unipolar current to said current source terminal at a first potential and sinking said precision unipolar current from said current sink terminal at a second potential;
    a summing terminal for receiving an analog signal current;
    means for enabling the precision unipolar current to flow by way of a first direction through said enabling means to said current sink terminal from a reference potential, through said floating first means to said current source terminal, from said current source terminal to said summing terminal during a first mode of operation and to flow by way of a second direction through said enabling means from said summing terminal to the current sink terminal, through said floating first means to said current source terminal, from said current source terminal to the reference potential during a second mode of operation;

said floating first means being further characterized to apply a voltage essentially equivalent to said voltage reference between said scaling resistor first and second terminals to control the value of said precision unipolar current from said current source terminal through said means for enabling to said current sink terminal, said precision unipolar current value being relatively independent of said current source terminal first potential and said current sink terminal second potential, said precision unipolar current value being relatively equal to the value of said precision voltage reference divided by said scaling resistor predetermined resistance value;

an integrator coupled to the summing terminal for generating a voltage signal proportional to the integral of the sum of the precision unipolar current and analog signal current flowing through said summing terminal;

a timing source for providing timing signals, and second means, coupled to said enabling means, said second means being responsive to said timing signals from said timing source and to the voltage signal for controlling the first and second modes of operation of said means for enabling; and, for generating a digital represenation of the amplitude of the analog signal current.

2. The system of claim 1 wherein said means for enabling comprises:

a bridge array of first and second pairs of switches coupled to said floating first means, said first pair of switches enabling the precision unipolar current to flow by way of a first path through a first switch of said first pair of switches from the reference potential through said floating first means, through a second switch of said first pair of switches to said summing terminal during said first mode of operation;

said second pair of switches enabling the precision unipolar current to flow by way of a second path through said first switch of said second pair of switches from said summing terminal through said floating first means, through said second switch of said second pair of switches to the reference potential during said second mode of operation.

3. The system of claim 1 wherein said second means comprises:

an incremental pulse width modulation circuit responsive to the voltage signal, the clock pulses and reference signal for generating first and second complementary signals to control the first and second modes of operation of said enabling means; and an output circuit responsive to a preselected one of the first and second complementary signals; and, to the clock pulses for generating the digital representation of the amplitude of the analog current.

4. The system of claim 3 wherein said incremental pulse width modulation circuit comprises:

a generator responsive to the reference signal for developing a preselected signal waveform;

a comparator for developing a third signal in response to the voltage signal and the preselected signal waveform, the third signal being in a first binary state when the voltage signal is in a first polarity relationship with respect to the preselected signal waveform and in a second binary state when the voltage signal is in a second polarity relationship with respect to the preselected signal waveform; and a flip-flop responsive to the third signal and the clock pulses for developing the first and second complementary signals.

5. The system of claim 3 wherein said output circuit comprises:

a gating circuit responsive to the preselected one of the first and second complementary signals for passing clock pulses during one of said modes of operation and for blocking clock pulses during the other of said modes of operation in order to generate the digital representation of the amplitude of the analog current.

6. The combination of claim 1 wherein said voltage source means further comprises:

a differential voltage reference source having first and second reference voltage source terminals, said differential reference voltage source providing first and second reference voltages with respect to said reference potential at said first and second reference voltage source terminals;

each respective floating first means has:
 a current scaling resistor having a first and second terminal,
 a current sink terminal, coupled to said enabling means,
 a current source terminal, coupled to said enabling means,
 a first floating voltage follower means coupled to said current sink terminal for sourcing said unipolar current from said current sink terminal to said resistor first terminal,
 a second floating voltage follower means for sourcing said unipolar current from said resistor second terminal to said current source terminal,
 said first and second floating voltage follower means each having respective inputs coupled to respective first and second reference voltage source terminals,
 said first floating voltage follower providing a voltage essentially equivalent to said first reference voltage at said resistor first terminal, and
 said second floating voltage follower means providing a voltage essentially equivalent to said second reference voltage at said resistor second terminal,
 each respective means for enabling being characterized as sourcing said unipolar current to said current sink terminal and sinking said unipolar current from said current source terminal;
 whereby, said first and second voltage follower means operates to control the unipolar current magnitude to be equal to the ratio of the voltage difference between said first and second reference voltage terminals, to the scaling resistor resistance.

7. The combination of claim 6 wherein, said enabling means comprises:

a bridge array of first and second pairs of switches, said first pair of switches enabling the unipolar current to flow by way of a first path from the reference potential to said floating first means current sink terminal, through said floating first means to said floating first means current source terminal, through said first pair of switches to said summing terminal during said first mode of operation, and said second pair of switches enabling the unipolar current to flow by way of a second path from the summing terminal to said floating first means current sink terminal, through said floating first means to said floating first means current source terminal, through said second pair of switches to said voltage reference terminal during said second mode of operation.

8. The combination of claim 7 wherein each respective first and second floating voltage follower means further comprises:

a respective isolated differential voltage source having at least a power and a return terminal, a respective differential amplifier, each respective amplifier having a power input terminal coupled to its respective isolated differential voltage source power terminal and its respective power return terminal coupled to its respective isolated differential voltage source return terminal, each respective differential amplifier also having, an output terminal,
an inverting input terminal, and
a non-inverting input terminal, said first differential amplifier output terminal being coupled to said first differential amplifier inverting input terminal and to said scaling resistor first terminal, said second differential amplifier output terminal being coupled to said second differential amplifier inverting input terminal and to said scaling resistor second terminal, said first differential amplifier power return terminal being coupled to said current sink terminal;

said second differential amplifier power input terminal being coupled to said current source terminal;

whereby, said first differential amplifier operates to conduct unipolar current from said current sink terminal to said scaling resistor first terminal and said second differential amplifier operates to conduct the unipolar current from said scaling resistor second terminal to said current source terminal.

9. An analog-to-digital conversion system comprising:

a voltage source means referenced to a reference potential, such as ground, for providing at least one precision voltage reference source, at least one analog-to-digital conversion channel, each respective analog-to-digital conversion channel having:

a floating first means for generating a precision unipolar current, each respective floating first means being responsive to said precision voltage reference and having:

a scaling resistor, having a predetermined resistance value, and a first and second terminal;
a current source terminal, and
a current sink terminal;

said floating first means being characterized as sourcing said precision unipolar current to said current source terminal at a first potential and sinking said precision unipolar current from said current sink terminal at a second potential;

a summing terminal for receiving an analog signal current, an integrator coupled to the summing terminals and having an input, said integrator generating a first voltage signal proportional to the integral of the sum of an analog current and precision unipolar currents flowing through said input;

a bridge array of switches controlled by a control signal having first and second voltage levels for enabling the precision unipolar constant current to flow by way of a first direction through said bridge array of switches to said current sink terminal from a reference potential, through said floating first means to said current source terminal, from said current source terminal to said input of said integrator during the first voltage level of the control signal, and to flow by way of a second direction through said bridge array of switches from said input of said integrator to the current sink terminal, through said floating first means to said current source terminal, from said current source terminal to the reference potential during the second voltage level of the control signal;

said floating first means being further characterized to apply a voltage essentially equivalent to said voltage reference between said scaling resistor first and second terminals to control the value of said precision unipolar current from said current source terminal through said means for enabling to said current sink terminal, said precision unipolar current value being relatively independent of said current source terminal first potential and said current sink terminal second potential, said precision unipolar current value being relatively equal to the value of said precision voltage reference divided by said scaling resistor predetermined resistance value; and means responsive to the first signal for developing the control signal as a function of the amplitude of the analog current and or generating a digital representation of the amplitude of the analog current.

10. The converter of claim 9 wherein said means for developing the control signal comprises:

a source of second and third signals;
third means responsive to the voltage signal and reference timing signals for generating a comparison signal; and
fourth means responsive to the comparison and third signals for developing the control signal and for generating a digital representation of the amplitude of the analog current.

11. The converter of claim 10 wherein said third means comprises:

a generator responsive to the second signal for developing a triangle wave signal; and
a comparator responsive to the first signal and the triangle wave signal for generating the comparison signal.

12. The converter of claim 10 wherein said fourth means comprises:

a flip-flop responsive to the comparison signal and to said third signals for precisely developing the control signal as a function of the amplitude of the analog current; and
a gate circuit controlled by said flip-flop to pass third signals digitally representative of the amplitude of the analog current.

13. The combination of claim 9 wherein said voltage source means further comprises:

a differential voltage reference source having first and second reference voltage source terminals, said differential reference voltage source providing first and second reference voltages with respect to said reference potential at said first and second reference voltage source terminals; and wherein, said floating first means further comprises:
- a current scaling resistor having a first and second terminal,
- a current sink terminal, coupled to said enabling means,
- a current source terminal, coupled to said enabling means,
- a first floating voltage follower means having an input and an output, said input being coupled to said first reference voltage sink terminal for sourcing said unipolar current from said current sink terminal to said resistor first terminal,
- a second floating voltage follower means for sourcing said unipolar current from said resistor second terminal to said current source terminal,
- said first and second voltage follower means being characterized as duplicating said differential reference voltage between said scaling resistor first and second terminals;
- each respective enabling means being characterized as sourcing said unipolar current to said current sink terminal and to sink said unipolar current from said current source terminal;
- whereby, by duplicating said first and second voltage follower means operate to control the unipolar current magnitude to be = to the ratio of the voltage difference between said first and second reference voltage terminals to the scaling resistor resistance.

14. The combination of claim 13 wherein each respective first and second floating voltage follower means further comprises:
- a respective isolated differential voltage source having at least power and a return terminal,
- a respective differential amplifier, each respective amplifier having a power input terminal coupled to its respective isolated differential voltage source power terminal and its respective power return terminal coupled to its respective isolated differential voltage source return terminal, each respective differential amplifier also having:
  - an output terminal,
  - an inverting input terminal, and
  - a non-inverting input terminal;
- said first differential amplifier output terminal being coupled to said first differential amplifier inverting input terminal and to said scaling resistor first terminal;
- said second differential amplifier output terminal being coupled to said second differential amplifier inverting input terminal and to said scaling resistor second terminal;
- said first differential amplifier power return terminal being coupled to said current sink terminal;
- said second differential amplifier power input terminal being coupled to said current source terminal;
- whereby, said first differential amplifier operates to conduct unipolar current from said current sink terminal to said scaling resistor first terminal and said second differential amplifier operates to conduct the unipolar current from said scaling resistor second terminal to said current source terminal.

15. An analog-to-digital converter comprising:
- a reference terminal having a reference potential;
- a voltage source means referenced to a reference potential for providing at least one precision voltage reference;

said voltage source means having:
- a differential voltage reference source having first and second reference voltage source terminals;
- said differential voltage reference source providing a differential reference voltage between said first and second reference voltage source terminals;
- a floating first means responsive to said precision voltage reference for providing a source of precision unipolar current, said floating first means having:
  - a current scaling resistor having a first and second terminal,
  - a current sink terminal,
  - a current source terminal,
  - a first floating voltage follower means coupled to said first reference voltage sink terminal for sourcing said unipolar current from said current sink terminal to said resistor first terminal;
  - a second floating voltage follower means for sourcing said unipolar current from said resistor second terminal to said current source terminal;
  - said first and second voltage follower means being characterized as duplicating said differential reference voltage between said scaling resistor first and second terminals,
- each respective first and second floating voltage follower means having;
  - a respective isolated differential voltage source having at least a power and a return terminal,
  - a respective differential amplifier, each respective amplifier having a power input terminal coupled to its respective isolated differential voltage source power terminal and its respective power return terminal coupled to its respective isolated differential voltage source return terminal, each respective differential amplifier also having;
    - an output terminal,
    - an inverting input terminal, and
    - a non-inverting input terminal,
- said first differential amplifier output terminal being coupled to said first differential amplifier inverting input terminal and to said scaling resistor first terminal;
- said second differential amplifier output terminal being coupled to said second differential amplifier inverting input terminal and to said scaling resistor second terminal;
- said first differential amplifier power return terminal being coupled to said current sink terminal;
- said second differential amplifier power input terminal being coupled to said current source terminal;
- said first differential amplifier operating to conduct unipolar current from said current sink terminal to said scaling resistor first terminal and said second differential amplifier operates to conduct said unipolar current from said scaling resistor second terminal to said current source terminal;
- said first and second voltage followers operate to control the unipolar current magnitude to be equal to the ratio of said differential reference voltage to said scaling resistor resistance;
- said precision unipolar current value being relatively independent of said current source terminal first potential and said current sink terminal second potential, the voltage difference between said current source terminal and current sink terminal being less than the voltage difference between said current scaling resistor's first and second terminal, enabling means for sourcing said unipolar current to said current sink terminal and to sink said unipolar current from said current source terminal, an integrator having a summing terminal for receiving an input analog current, said integrator being responsive to the sum of the input analog current and to the precision current, said precision current being controlled to alternately flow to and from said summing terminal for generating a voltage signal which ramps up and down;

said enabling means having a first, second, third and fourth FET transistor switch, each respective FET transistor switch having a conduction channel and a control gate, said first FET transistor switch having its conduction channel between said current sink terminal and said summing terminal, said second FET transistor having its conduction channel between said current source terminal and said summing terminal, said third FET transistor switch conduction channel having its conduction channel between said current sink terminal and said reference terminal, said fourth FET transistor switch conduction channel having its conduction channel between said current source terminal and said reference terminal, said first and fourth FET switches being responsive to the first state of control signal having a first and second state to provide a path for said precision unipolar current from said summing terminal to said current sink terminal through said floating first means to said current source terminal, and from said current source terminal to said reference terminal, said second and third FET switches being responsive to said control signal second state to provide a path for said precision unipolar current from said reference terminal to said current sink terminal, through said floating first means to said current terminal and to said summing terminal; and control means responsive to the voltage signal developing the control signal.

16. The converter of claim 15 wherein said control means comprises:

first means for developing clock pulses;

second means responsive to voltage levels reached by the voltage signal as it ramps up and down to develop a comparison signal having first and second states; and third means responsive to the comparison signal for developing the control signal, the control signal copying each change of state of the comparison signal in response to the next clock pulse that occurs after each change of state of the comparison signal.

17. The converter of claim 16 wherein said second means comprises:

a generator for developing a periodic reference waveform; and a comparator responsive to the reference waveform and the voltage signal for developing the first and second states of the comparison signal as a function of the relative voltage levels of the reference waveform and the second signal.

18. The converter of claim 17, wherein:

said generator develops the reference waveform in synchronization with the clock pulses and at a frequency which is an integral submultiple of that of the clock pulses.

19. The converter of claim 18 wherein said control means further includes:

fourth means responsive to the first and second states of the control signal and to the clock pulses for precisely developing a digital representation of the amplitude of the input analog current.

* * * * *